United States Patent
Yamamoto

(10) Patent No.: US 6,876,401 B2
(45) Date of Patent: Apr. 5, 2005

(54) FM-BROADCAST-RECEIVABLE TELEVISION TUNER FOR PREVENTING ADJACENT-CHANNEL INTERFERENCE

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 446 days.

(21) Appl. No.: 10/153,748

(22) Filed: May 22, 2002

(65) Prior Publication Data

US 2002/0176027 A1 Nov. 28, 2002

(30) Foreign Application Priority Data

May 24, 2001 (JP) ........................................ 2001-156008

(51) Int. Cl.[7] .............................. H04N 5/44; H04N 5/50
(52) U.S. Cl. ........................ 348/729; 348/736; 348/737; 455/188.1; 455/193.3
(58) Field of Search ................................. 348/725–729, 348/731, 733, 735–738; 375/344–345; 455/180.2–180.3, 179.1, 180.1, 188.1, 191.2–191.3, 193.1, 193.3; H04N 5/44, 5/50

(56) References Cited

U.S. PATENT DOCUMENTS

| 5,644,368 A | * | 7/1997 | Natsume ..................... 348/737 |
| 5,864,373 A | * | 1/1999 | Hatano ....................... 348/737 |
| 6,342,928 B1 | * | 1/2002 | Ohira ......................... 348/729 |
| 6,351,294 B1 | * | 2/2002 | Yamamoto et al. ......... 348/731 |
| 6,573,940 B1 | * | 6/2003 | Yang .......................... 348/441 |
| 6,683,656 B1 | * | 1/2004 | Kikuchi ...................... 348/729 |
| 6,731,348 B2 | * | 5/2004 | Osada et al. ................ 348/729 |
| 6,791,626 B2 | * | 9/2004 | Yamamoto et al. ......... 348/729 |
| 6,795,128 B2 | * | 9/2004 | Yamamoto .................. 348/729 |
| 2002/0191118 A1 | * | 12/2002 | Yamamoto .................. 348/731 |

FOREIGN PATENT DOCUMENTS

| JP | 2001-157128 | 6/2001 |
| JP | 2002-027341 | 1/2002 |

* cited by examiner

Primary Examiner—Brian P. Yenke
(74) Attorney, Agent, or Firm—Brinks Hofer Gilson & Lione

(57) ABSTRACT

A trap circuit system includes a first trap portion and a second trap portion. In the first trap portion, a first capacitor is provided in parallel to a first switch diode. A control voltage is applied to the cathode of the first switch diode so as to change the trap frequency. In the second trap portion, a control voltage is applied to the cathode of a varactor diode so as to change the trap frequency. In the trap circuit system, when a television signal is received, the video intermediate frequency signal and the audio intermediate frequency signal in the lower adjacent channel are attenuated. When an FM broadcast signal is received, the video intermediate frequency signal and the chrominance subcarrier frequency signal are attenuated.

5 Claims, 3 Drawing Sheets

FM-BROADCAST-RECEIVABLE TELEVISION TUNER FOR PREVENTING ADJACENT-CHANNEL INTERFERENCE

BACKGROUND OF THE INVENTION

1. Field of the Invention

The present invention relates to a television tuner which is able to receive not only television signals, but also FM broadcast signals.

2. Description of the Related Art

A television signal and an FM broadcast signal have different bandwidths. The bandwidth of the television signal is 6 MHz, while the bandwidth of the FM broadcast signal is 200 KHz.

The configuration of a known television tuner is described below with reference to FIG. 4. In FIG. 4, a television signal received by a television antenna 41 and an FM broadcast signal received by an FM antenna 42 are input into an antenna duplexer 43.

The antenna duplexer 43 selects one of the input television signal or the input FM broadcast signal, and outputs the selected signal to a high-frequency tuned circuit 45. The selection of the signal by the antenna duplexer 43 is controlled by a switch circuit 44.

The switch circuit 44 includes a switch transistor 44b whose base is connected to an input terminal 44a, emitter is grounded by a resistor 44c, and collector is connected to a control terminal 43a of the antenna duplexer 43. A power supply voltage MB is applied to the collector of the switch transistor 44b via a resistor.

The input television signal or FM broadcast signal is tuned in the high-frequency tuned circuit 45 and is then input into a mixer 46. The mixer 46 is connected to the high-frequency tuned circuit 45 and is also connected to a local oscillator 47. Accordingly, the television signal is converted into an intermediate frequency having a center frequency of 44 MHz, and the FM broadcast signal is converted to 41.25 MHz, which corresponds to the audio intermediate frequency.

The frequency-converted television signal or FM broadcast signal is input into an intermediate-frequency tuned circuit system 48. The intermediate-frequency tuned circuit system 48, which is a balanced circuit, includes a first parallel tuned circuit 49, a second parallel tuned circuit 50, and a second switch diode 51 connected in series to the second parallel tuned circuit 50. The first parallel tuned circuit 49 includes a sixth capacitor 52 and series-connected third inductors 53a and 53b, and is tuned at 44 MHz, which is the center frequency of the intermediate frequency band, and the bandwidth is 6 MHz. The second parallel tuned circuit 50 includes a seventh capacitor 54 and a fourth inductor 55, and is tuned at 38 MHz, and the bandwidth is about 1.8 MHz. A series circuit of the second parallel tuned circuit 50 and the second switch diode 51 is connected in parallel to the first parallel tuned circuit 49. A voltage obtained by dividing the power supply voltage MB is applied to a node between the third inductors 53a and 53b and is also applied to the anode of the second switch diode 51 via the third inductor 53b. The cathode of the second switch diode 51 is connected to the collector of the switch transistor 44b.

An intermediate frequency amplifier 56 is connected to the intermediate-frequency tuned circuit system 48. The intermediate frequency amplifier 56 is a balanced-input and unbalanced-output type, and the output thereof is connected to an output circuit system 57.

The output circuit system 57 includes a parallel circuit consisting of a first switch diode 58 and a first capacitor 59, a first inductor 60 connected in series to this parallel circuit, a DC-cut capacitor 63, and a fifth capacitor 61, and a resistor 62. The fifth capacitor 61 and the resistor 62 shunt nodes between the first inductor 60 and the DC-cut capacitor 63 to grounds. The parallel circuit of the first switch diode 58 and the first capacitor 59, the first inductor 60, and the fifth capacitor 61 form a peaking circuit. A predetermined bias voltage is applied to the anode of the first switch diode 58 from the intermediate frequency amplifier 56. The cathode of the first switch diode 58 is connected to the collector of the switch transistor 44b via the first inductor 60.

In the above-configured television tuner, when a television signal is received, a low level voltage is applied to the input terminal 44a of the switch circuit 44. Then, the switch transistor 44b is turned off so that the collector voltage of the switch transistor 44b is changed to a high level. Thus, the antenna duplexer 43 connects the television antenna 41 to the high-frequency tuned circuit 45.

The second switch diode 51 is turned off, and only the first parallel tuned circuit 49 becomes effective in the intermediate-frequency tuned circuit system 48. As a result, the tuned frequency is 44 MHz, and the bandwidth is 6 MHz.

The first switch diode 58 is turned off, and a video intermediate frequency undergoes a peaking operation by the first capacitor 59, the first inductor 60, and the fifth capacitor 61, and the intermediate-frequency television signal is output from the television tuner.

On the other hand, when an FM broadcast signal is received, a high level voltage is applied to the input terminal 44a of the switch circuit 44. Then, the switch transistor 44b is turned on so that the collector voltage of the switch transistor 44b is changed to a low level. Accordingly, the antenna duplexer 43 connects the FM antenna 42 to the high-frequency tuned circuit 45.

The second switch diode 51 is turned on, and thus, both the first parallel tuned circuit 49 and the second parallel tuned parallel circuit 50 become effective in the intermediate-frequency tuned circuit system 48. As a result, the total tuned frequency of the first and second parallel tuned circuits 49 and 50 is 41.25 MHz, and the bandwidth becomes 1.5 MHz.

The first switch diode 58 is turned on, and an audio intermediate frequency undergoes a peaking operation by the first inductor 60 and the fifth capacitor 61, and the audio-frequency FM broadcast signal is output from the television tuner. In this case, a bias current from the intermediate frequency amplifier 56 passes through the first switch diode 58 and flows into a ground via the resistor 62.

In the above-described known television tuner, the tuned frequency and the bandwidth are changed according to whether a television signal or an FM broadcast signal is received. However, the selection characteristics are insufficient, and adjacent-channel interference cannot be sufficiently prevented.

SUMMARY OF THE INVENTION

Accordingly, it is an object of the present invention to provide a smaller television tuner in which adjacent-channel interference can be sufficiently prevented.

In order to achieve the above-described object, the present invention provides a television tuner including a mixer for receiving a television signal or an FM broadcast signal, and for converting the television signal to an intermediate frequency in a television intermediate frequency band and for converting the FM broadcast signal to an audio intermediate frequency in the television intermediate frequency band. An intermediate frequency amplifier is provided at a stage subsequent to the mixer. A trap circuit system is provided at a stage subsequent to the intermediate frequency amplifier and is configured to change a trap frequency. The trap frequency is positioned at a video intermediate frequency and an audio intermediate frequency in a lower adjacent channel when the television signal is received, and the trap frequency is positioned at the video intermediate frequency and a chrominance subcarrier frequency when the FM broadcast signal is received.

According to the above-described FM-broadcast-receivable television tuner of the present invention, the trap circuit system is provided. Thus, when a television signal is received, the video intermediate frequency signal and the audio intermediate frequency signal in the lower adjacent channel can be attenuated. When an FM broadcast signal is received, the video intermediate frequency signal and the chrominance subcarrier frequency signal can be attenuated. Accordingly, both the adjacent channel of the television signal and the adjacent channel of the FM broadcast signal can be attenuated by the single trap circuit system. It is thus possible to prevent adjacent-channel interference with a small circuit.

In the aforementioned television tuner, the trap circuit system may include a trap portion having a parallel circuit which consists of a first switch diode and a first capacitor, the first switch diode and the first capacitor being connected in parallel to each other, a first inductor connected in series to the parallel circuit, and a second capacitor connected in parallel to a series circuit consisting of the parallel circuit and the first inductor. When the television signal is received, the first switch diode may be set to a non-conducting state so that the first trap portion produces parallel resonance at one of the audio intermediate frequency and the video intermediate frequency of the lower adjacent channel. When the FM broadcast signal is received, the first switch diode may be set to a conducting state so that the first trap portion produces parallel resonance at one of the video intermediate frequency and the chrominance subcarrier frequency.

With this arrangement, the trap frequency can be switched by turning on or off the first switch diode. Thus, the frequency can be switched with a small circuit.

In the aforementioned television tuner, the trap circuit system may include a second trap portion having a varactor diode and a second inductor, the varactor diode and the second inductor being connected in series to each other. A first terminal of the second trap portion may be connected to an input terminal or an output terminal of the first trap portion, or to a node between the parallel circuit and the first inductor of the first trap portion, and a second terminal of the second trap portion may be connected to a ground. When the television signal is received, a high level voltage may be applied to the cathode of the varactor diode so that the second trap portion produces series resonance at the other one of the video intermediate frequency and the audio intermediate frequency of the lower adjacent channel. When the FM broadcast signal is received, a low level voltage may be applied to the cathode of the varactor diode so that the second trap portion produces series resonance at the other one of the chrominance subcarrier frequency and the video intermediate frequency.

With this arrangement, the trap frequency is switched by changing the bias voltage to be applied to the varactor diode. Thus, the trap frequency can be switched with a small circuit.

In the aforementioned television tuner, a first terminal of the second trap portion may be connected to the node between the parallel circuit and the first inductor of the first trap portion, and the cathode of the switch diode and the cathode of the varactor diode being connected to each other, the high level voltage or the low level voltage being applied to the cathode of the switch diode and the cathode of the varactor diode.

With this arrangement, the trap frequencies of the first and second trap portions are switched by applying a high level voltage or a low level voltage to the first switch diode and the varactor diode. Thus, the two trap portions can be controlled by the single switch circuit, thereby making it possible to reduce the size of the circuit.

In the aforementioned television tuner, a third capacitor may be provided in parallel to the varactor diode.

With this arrangement, even if a control voltage having a sufficient magnitude for turning on or off the first switch diode of the first trap portion is applied to the varactor diode of the second trap portion, the ratio of a change in the equivalent capacitance of the varactor diode and the third capacitor can be adjusted to a suitable value.

DESCRIPTION OF THE PREFERRED EMBODIMENTS

A television tuner of the present invention is described below with reference to FIGS. 1 through 3.

Figure 1:
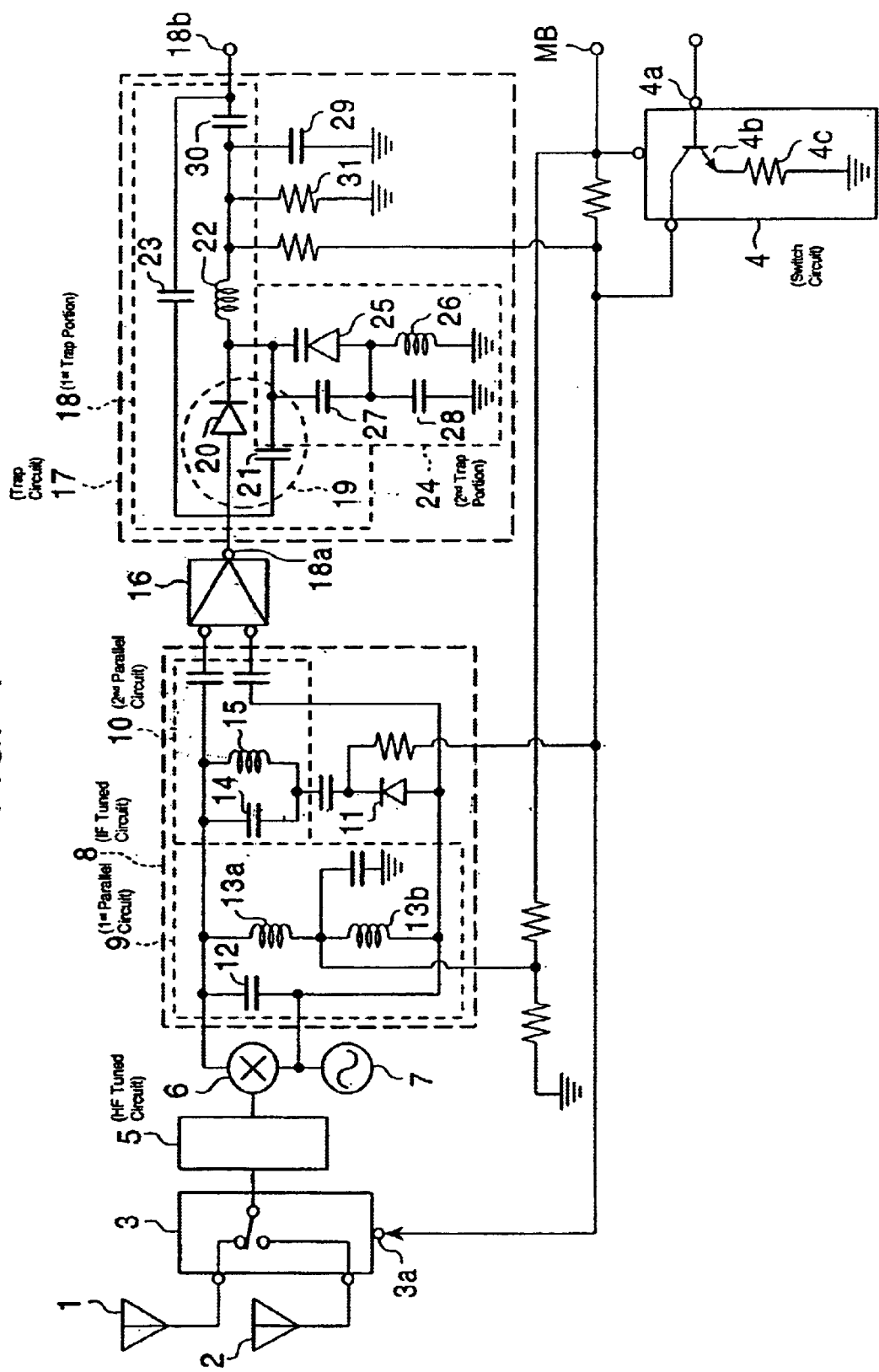
FIG. 1 is a circuit diagram illustrating a television tuner according to an embodiment of the present invention.

FIG. 1 is a circuit diagram illustrating a television tuner according to an embodiment of the present invention. In FIG. 1, a television signal received by a television antenna 1 and an FM broadcast signal received by an FM antenna 2 are input into an antenna duplexer 3.

The antenna duplexer 3 is connected to a switch circuit 4, and selects one of the input television signal and the input FM broadcast signal and inputs the selected signal to a high-frequency tuned circuit 5. The selection of the signal by the antenna duplexer 3 is controlled by the switch circuit 4.

The switch circuit 4 includes a switch transistor 4b whose base is connected to an input terminal 4a, emitter is grounded by a resistor 4c, and collector is connected to a control terminal 3a of the antenna duplexer 3. A power supply voltage MB is applied to the collector of the switch transistor 4b via a resistor.

The television signal or the FM broadcast signal is tuned in the high-frequency tuned circuit 5, and is then input into a mixer 6. The mixer 6 is connected to the high-frequency tuned circuit 5, and is also connected to a local oscillator 7. Accordingly, the television signal is converted into an intermediate frequency having a center frequency of 44 MHz, and the FM broadcast signal is converted into 41.25 MHz, which corresponds to the audio intermediate frequency. The intermediate-frequency television signal or FM broadcast signal has a frequency equal to the difference between the frequency of the local oscillation signal and the frequency of the signal received by the antenna. Accordingly, the lower adjacent-channel signal has a higher frequency in the intermediate frequency band, while the upper adjacent-channel signal has a lower frequency in the intermediate frequency band.

The frequency-converted television signal or FM broadcast signal is input into an intermediate-frequency tuned circuit system 8. The intermediate-frequency tuned circuit system 8, which is a balanced circuit, includes a first parallel tuned circuit 9, a second parallel tuned circuit 10, and a second switch diode 11 connected in series to the second parallel tuned circuit 10. The first parallel tuned circuit 9 includes a sixth capacitor 12 and series-connected third inductors 13a and 13b, and is tuned at 44 MHz, which is the center frequency of the intermediate frequency band, and the bandwidth is 6 MHz. The second parallel tuned circuit 10 includes a seventh capacitor 14 and a fourth inductor 15, and is tuned at 38 MHz, and the bandwidth is about 1.8 MHz. A series circuit consisting of the second parallel tuned circuit 10 and the second switch diode 11 is connected in parallel to the first parallel tuned circuit 9. A voltage obtained by dividing the power supply voltage MB is applied to a node between the third inductors 13a and 13b and is also applied to the anode of the second switch diode 11 via the third inductor 13b. The cathode of the second switch diode 11 is connected to the collector of the switch transistor 4b.

An intermediate frequency amplifier 16 is connected to the intermediate-frequency tuned circuit system 8. The intermediate frequency amplifier 16 is a balanced-input and unbalanced-output type, and the output thereof is connected to a trap circuit system 17.

The trap circuit system 17 includes a first trap portion 18 and a second trap portion 24. The first trap portion 18 is formed of a parallel circuit 19 consisting of parallel-connected first switch diode 20 and a first capacitor 21, a first inductor 22 connected in series to the parallel circuit 19, a DC-cut capacitor 30, and a second capacitor 23 connected in parallel to a series circuit consisting of the parallel circuit 19, the first inductor 22, and the DC-cut capacitor 30. One end of the second trap portion 24 is connected to a node between the parallel circuit 19 and the first inductor 22. The second trap portion 24 includes a varactor diode 25 and a second inductor 26, which are connected in series to each other. The anode of the varactor diode 25 is grounded via the second inductor 26. A third capacitor 27 is connected in parallel to the varactor diode 25, and the varactor diode 25 and the third capacitor 27 form a capacitance of the second trap portion 24. A fourth capacitor 28 is connected in parallel to the second inductor 26, and the second inductor 26 and the fourth capacitor 28 form an inductance of the second trap portion 24. A node between the first inductor 22 and the DC-cut capacitor 30 is grounded via a fifth capacitor 29. The parallel circuit 19, the first inductor 22, and the fifth capacitor 29 produce series resonance and are operated as a peaking circuit. A predetermined bias voltage is applied to the anode of the first switch diode 20 from the intermediate frequency amplifier 16. The cathode of the first switch diode 20 and the cathode of the varactor diode 25 are connected to the collector of the switch transistor 4b via the first inductor 22. A node between the first inductor 22 and the DC-cut capacitor 30 is grounded via a resistor 31.

In the above-configured television tuner, when a television signal is received, a low level voltage is applied to the input terminal 4a of the switch circuit 4. Then, the switch transistor 4b is turned off so that the collector voltage of the switch transistor 4b is changed to a high level. Accordingly, the antenna switch 3 connects the television antenna 1 to the high-frequency tuned circuit 5.

Since the cathode of the second switch diode 11 becomes a high level, the second switch diode 11 is turned off, and only the first parallel tuned circuit 9 becomes effective in the intermediate-frequency tuned circuit system 8. As a result, the tuned frequency becomes 44 MHz, and the bandwidth becomes 6 MHz.

Since the cathode voltages of the first switch diode 20 and the varactor diode 25 become a high level, the first switch diode 20 is turned off, and also, the capacitance of the varactor diode 25 becomes smaller. The equivalent circuit diagram of the trap circuit system 17 in this state is indicated as shown in FIG. 2.

Figure 2:
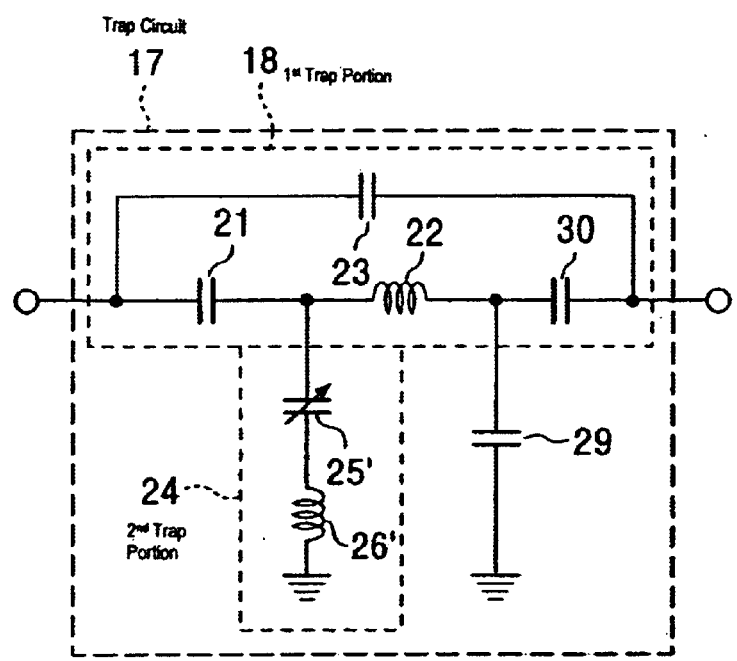
FIG. 2 is an equivalent circuit diagram of a trap circuit system when a television signal is received.

In FIG. 2, the synthesized impedance of the first capacitor 21, the first inductor 22, and the DC-cut capacitor 30 becomes inductive in the intermediate frequency band, and thus, the first trap portion 18 produces parallel resonance. In this state, the first trap portion 18 produces parallel resonance in the audio intermediate frequency of the lower adjacent channel (47.25 MHz).

An equivalent capacitance 25' of the varactor diode 25 and the third capacitor 27 and an equivalent inductance 26' of the second inductor 26 and the fourth capacitor 28 form the second trap portion 24. In this state, the second trap portion 24 produces series resonance in the video intermediate frequency of the lower adjacent channel (51.75 MHz).

Accordingly, when a television signal is received, the audio intermediate frequency signal of the lower adjacent channel and the video intermediate frequency signal of the lower adjacent channel are attenuated by the first trap portion 18 and the second trap portion 24, respectively, thereby suppressing interference from the lower adjacent channel.

The video intermediate frequency undergoes a peaking operation by the first capacitor 21, the first inductor 22, and the fifth capacitor 29.

On the other hand, when an FM broadcast signal is received, a high level voltage is applied to the input terminal 4a of the switch circuit 4. Then, the switch transistor 4b is turned on so that the collector voltage of the switch transistor 4b is changed to a low level. Accordingly, the antenna duplexer 3 connects the FM antenna 2 to the high-frequency tuned circuit 5.

Since the cathode voltage of the second switch diode 11 becomes a low level, the second switch diode 11 is turned on, and both the first parallel tuned circuit 9 and the second parallel tuned circuit 10 become effective in the intermediate-frequency tuned circuit system 8. As a result, the total tuned frequency of the first and second parallel tuned circuits 9 and 10 is 41.25 MHz, and the bandwidth is 1.5 MHz.

Since the cathode voltages of the first switch diode 20 and the varactor diode 25 are decreased, the first switch diode 20 is turned on, and the capacitance of the varactor diode 25 is increased. In this case, a bias current from the intermediate frequency amplifier 16 passes through the first switch diode 20 and flows into a ground via the resistor 31. The equivalent circuit diagram of the trap circuit system 17 in this state is indicated, as shown in FIG. 3.

Figure 3:
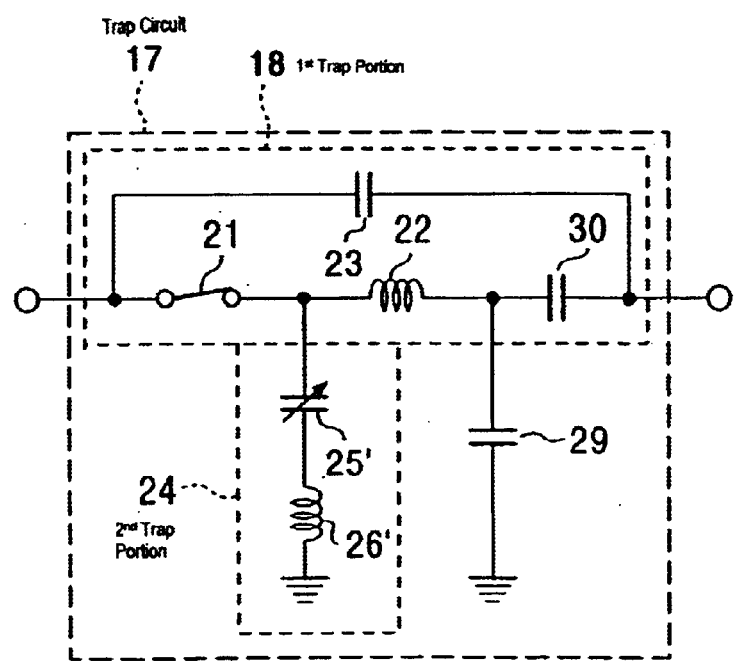
FIG. 3 is an equivalent circuit diagram of the trap circuit system when an FM broadcast signal is received.
Figure 4:
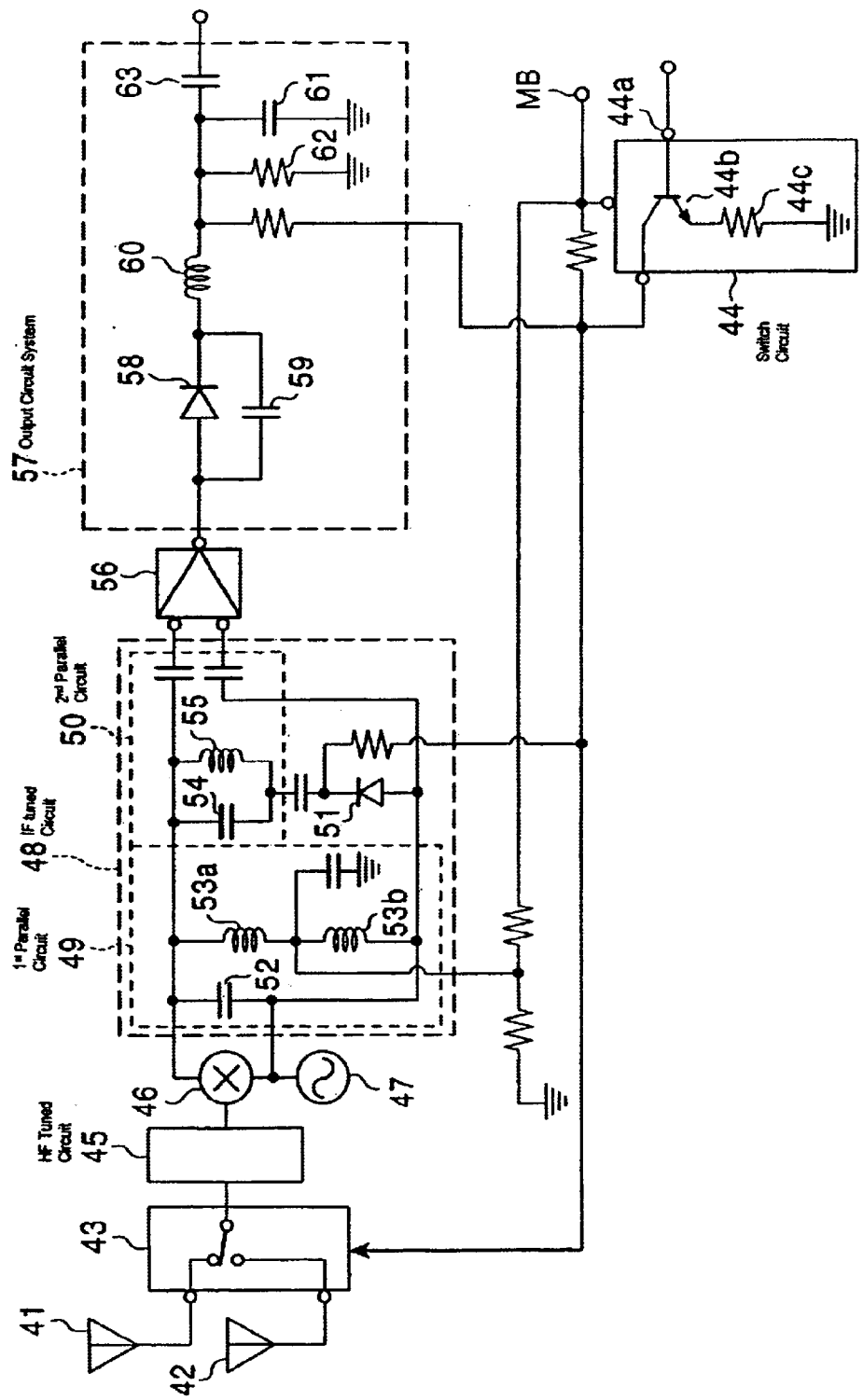
FIG. 4 is a circuit diagram illustrating an example of a known television tuner.

In FIG. 3, the first switch diode 20 is in a conducting state. The synthesized impedance of the first inductor 22 and the DC-cut capacitor 30 is inductive in the intermediate frequency band, and thus, the first trap portion 18 produces parallel resonance in the video intermediate frequency (45.75 MHz).

The equivalent capacitance 25' of the varactor diode 25 and the third capacitor 27 and the equivalent inductance 26' of the second inductor 26 and the fourth capacitor 28 form the second trap portion 24. In this state, the second trap portion 24 produces series resonance in the vicinity of the chrominance subcarrier frequency (about 43.42 MHz).

Accordingly, when an FM broadcast signal is received, the video intermediate frequency signal and the chrominance subcarrier frequency signal are attenuated by the first trap portion 18 and the second trap portion 24, respectively. Thus, the sufficient selection characteristics for receiving FM broadcast signals can be obtained, thereby suppressing adjacent-channel interference.

Additionally, the audio intermediate frequency undergoes a peaking operation by the first inductor 22 and the fifth capacitor 29.

In the above-described embodiment of the present invention, when a television signal is received, the first trap portion 18 attenuates the audio intermediate frequency in the lower adjacent channel, and the second trap portion 24 attenuates the video intermediate frequency in the lower adjacent channel. However, the first trap portion 18 may attenuate the video intermediate frequency in the lower adjacent channel, and the second trap portion 24 may attenuate the audio intermediate frequency in the lower adjacent channel when receiving a television signal. Additionally, when an FM broadcast signal is received, the first trap portion 18 attenuates the video intermediate frequency signal, and the second trap portion 24 attenuates the chrominance subcarrier frequency signal. However, the first trap portion 18 may attenuate the chrominance subcarrier frequency signal, and the second trap portion 24 may attenuate the video intermediate frequency signal. Additionally, in the above-described embodiment, one end of the second trap portion 24 is connected to a node between the parallel circuit 19 and the first inductor 22. However, it may be connected to an input terminal 18a or an output terminal 18b of the first trap portion 18.

What is claimed is:

1. A television tuner comprising:
   a mixer for receiving a television signal or an FM broadcast signal, and for converting the television signal to an intermediate frequency in a television intermediate frequency band and for converting the FM broadcast signal to an audio intermediate frequency in the television intermediate frequency band;
   an intermediate frequency amplifier provided at a stage subsequent to said mixer; and
   a trap circuit system provided at a stage subsequent to said intermediate frequency amplifier and configured to change a trap frequency,
   wherein the trap frequencies are positioned at a video intermediate frequency and an audio intermediate frequency in a lower adjacent channel when the television signal is received, and the trap frequencies are positioned at the video intermediate frequency and a chrominance subcarrier frequency when the FM broadcast signal is received.

2. A television tuner according to claim 1, wherein:
   said trap circuit system comprises a first trap portion including a parallel circuit which consists of a first switch diode and a first capacitor, the first switch diode and the first capacitor being connected in parallel to each other, a first inductor connected in series to the parallel circuit, and a second capacitor connected in parallel to a series circuit consisting of the parallel circuit and the first inductor; and
   when the television signal is received, the first switch diode is set to a non-conducting state so that said first trap portion produces parallel resonance at one of the audio intermediate frequency and the video intermediate frequency of the lower adjacent channel, and when the FM broadcast signal is received, the first switch diode is set to a conducting state so that said first trap portion produces parallel resonance at one of the video intermediate frequency and the chrominance subcarrier frequency.

3. A television tuner according to claim 2, wherein:
   said trap circuit system comprises a second trap portion including a varactor diode and a second inductor, the varactor diode and the second inductor being connected in series to each other;
   a first terminal of said second trap portion is connected to an input terminal or an output terminal of said first trap portion, or to a node between the parallel circuit and the first inductor of said first trap portion, and a second terminal of said second trap portion is connected to a ground; and
   when the television signal is received, a high level voltage is applied to a cathode of the varactor diode so that said second trap portion produces series resonance at the other one of the video intermediate frequency and the audio intermediate frequency of the lower adjacent channel, and when the FM broadcast signal is received, a low level voltage is applied to the cathode of the varactor diode so that said second trap portion produces series resonance at the other one of the chrominance subcarrier frequency and the video intermediate frequency.

4. A television tuner according to claim 3, wherein the first terminal of the second trap portion is connected to the node between the parallel circuit and the first inductor of said first trap portion, and a cathode of said switch diode and the cathode of said varactor diode being connected to each other, the high level voltage or the low level voltage being applied to the cathode of the switch diode and the cathode of the varactor diode.

5. A television tuner according to claim 4, wherein a third capacitor is provided in parallel to the varactor diode.

* * * * *